(12) United States Patent
Torek et al.

(10) Patent No.: US 6,758,938 B1
(45) Date of Patent: Jul. 6, 2004

(54) DELIVERY OF DISSOLVED OZONE

(75) Inventors: Kevin J. Torek, Meridian, ID (US); Jonathan C. Morgan, Nampa, ID (US); Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,247

(22) Filed: Aug. 31, 1999

(51) Int. Cl.[7] ............................................. H01L 21/306
(52) U.S. Cl. ......................... 156/345.11; 156/345.18; 156/345.21; 156/345.26; 156/345.33; 156/345.34
(58) Field of Search ................. 156/345.11, 345.18, 156/345.21, 345.26, 345.33, 345.34; 134/1.2, 1.3; 261/DIG. 41; 438/745, 748

(56) References Cited

U.S. PATENT DOCUMENTS

| | | | | |
|---|---|---|---|---|
| 4,517,849 A | * | 5/1985 | Nakahori et al. | 73/863.31 |
| 5,431,861 A | | 7/1995 | Nagahiro et al. | 261/140.1 |
| 5,598,316 A | * | 1/1997 | Kasting, Jr. | 361/212 |
| 5,803,982 A | * | 9/1998 | Kosofsky et al. | 134/10 |
| 5,868,855 A | * | 2/1999 | Fukazawa et al. | 134/1.3 |
| 6,124,158 A | * | 9/2000 | Dautartas et al. | 438/216 |
| 6,132,629 A | * | 10/2000 | Boley | 210/760 |
| 6,162,629 A | * | 10/2000 | Boley | 210/760 |
| 6,145,519 A | * | 11/2000 | Konishi et al. | 134/95.2 |
| 6,273,108 B1 | * | 8/2001 | Bergman et al. | 134/102.1 |
| 6,274,506 B1 | * | 8/2001 | Christenson et al. | 438/748 |

* cited by examiner

*Primary Examiner*—Nadine G. Norton
*Assistant Examiner*—Binh X. Tran
(74) *Attorney, Agent, or Firm*—Knobbe, Martens, Olson & Bear, LLP (57) ABSTRACT

An apparatus and method for delivering ozone to a workpiece. In one embodiment, fluid is sprayed onto a workpiece placed in an ozone-rich environment. Alternatively, ozone is mixed with the fluid prior to spraying the fluid onto the workpiece. When spraying the fluid, the invention pulses the fluid at desired rates to create a substantially uniform layer of ozone-rich fluid on the workpiece. In another embodiment, the workpiece is also slowly rotated during at least a portion of the time the layer of ozone-rich fluid is applied to the workpiece.

31 Claims, 5 Drawing Sheets

DELIVERY OF DISSOLVED OZONE

BACKGROUND OF THE INVENTION

1. Field of the Invention

The present invention relates in general to semiconductor surface preparation, and in particular to the use of dissolved ozone to perform cleaning, etching, and stripping operations.

2. Background

During the wafer fabrication process, manufacturers found ozone to be a particularly useful active reagent. For example, manufacturers use ozone in at least the operations of sterilizing process chambers and wafers, etching oxides, stripping off photoresist material, and the like. For example, in one approach for removing photoresist from a workpiece, a manufacturer uses ozone to loosen undesired portions of photoresist. The manufacturer then washes the undesired portions of photoresist from the workpiece.

Because manufacturers repeat these operations many times in order to form complex semiconductor devices, it is important to maximize the efficiency of the ozone reaction with a workpiece, thereby increasing the speed of overall wafer fabrication. One way to increase the efficiency of the ozone reaction is to increase the overall amount or concentration of ozone that reaches the workpiece.

The concentration of ozone reaching the workpiece is adversely affected by, among other things, ineffective transport of ozone to the workpiece and interfering byproducts of the ozone reaction. In order to overcome such adverse affects, manufacturers discovered that water not only acts as a transport solution, but also washes away the interfering byproducts of the ozone reaction. Accordingly, manufacturers began using immersion tanks for operations that involved ozone reactions. In general, immersion tanks immerse the workpiece in a solution, e.g., ozone-enriched water, in order to provide ozone reactions. However, immersion tanks provide less efficient ozone transportation because although water does transport ozone, water also quickly decomposes some of the ozone into a useless solution. Therefore, water generally has an upper limit on a steady state of ozone concentration. In addition, immersion tanks do not wash away the interfering byproducts efficiently because the solutions in immersion tanks are relatively stable.

Therefore, manufacturers developed a "spin and spray" process in order to overcome the drawbacks of immersion tanks. In the spin and spray process, manufacturers spin the workpiece at high velocities while spraying water onto the workpiece in an ozone-enriched ambient. The velocity of the spinning workpiece controls the thickness of a water boundary layer formed thereon. By controlling the thickness of the water boundary layer, the manufacturers attempted to reduce the ability of the water to decompose the ozone before the ozone could reach the workpiece. This reduction in the ability of the water to decompose ozone helps provide ozone concentrations above the typical limit of the water.

However, the spin and spray process has a variety of drawbacks. For example, in order to provide the desired water boundary layer thickness, the workpiece needs to spin at velocities greater than approximately 800 rpm. Such spinning requires a large amount of mechanical complexity and poses a significant risk of damage to the workpiece. While mechanical complexity greatly increases the cost of the process chamber, damage to the workpiece lowers yield rates.

All of the above mentioned drawbacks give manufacturers the undesirable choice between using a low concentration of ozone, thereby substantially slowing overall wafer fabrication, or increasing the concentration of ozone, thereby greatly increasing the overall cost and risk.

SUMMARY OF THE INVENTION

One aspect of the invention is to provide an apparatus and method for delivering highly concentrated dissolved ozone to a workpiece in order to increase the ozone reaction therewith. According to one embodiment, the apparatus includes a process chamber employing an array of spray nozzles that spray a thin water boundary layer onto the workpiece. The water boundary layer transports ozone from the ozone-rich ambient to the workpiece. According to this embodiment, the workpiece is held substantially stationary.

According to another embodiment, fluid is pulsed through the spray nozzles. According to yet another embodiment of the invention, the pulsing of the water comprises a limited duty cycle. According to yet another embodiment, the wafers are slowly rotated to ensure the water boundary layer on the workpiece is sufficiently uniform.

The pulsing of water through the spray nozzles advantageously increases the water's ability to wash away the interfering byproducts of the ozone reaction without increasing the overall amount of water used. This is advantageous because it allows the water boundary layer on the wafers to be very thin. The thin water boundary layer transports ozone from the ozone-rich ambient to the workpiece without supplying enough water to detrimentally decompose the ozone. Thus, highly concentrated dissolved ozone reacts with the workpiece without including the drawbacks of mechanical complexity and risk associated with the spin and spray process.

In one embodiment, an apparatus comprises a pulsator that pulses a solution into an ozone-rich environment to create an ozone-rich solution. In another embodiment, an apparatus comprises a sprayer that periodically pulses an ozone-rich solution onto a wafer.

In yet another embodiment, an apparatus comprises a rotating platform that is configured to rotate the workpiece. The apparatus further comprises a pulsator that pulses a solution into an ozone-rich environment to create an ozone-rich solution on the workpiece. In an additional embodiment, the apparatus pulses an ozone-rich solution onto the workpiece.

One aspect of the invention relates to a method for stripping a layer from a semiconductor wafer. The method comprises introducing ozone into a process chamber and activating a water spray for a first predetermined amount of time, thereby creating a water layer on a semiconductor wafer, wherein the water layer transports high concentrations of the ozone to the semiconductor wafer. The method further comprises deactivating the water spray for a second predetermined amount of time, thereby controlling a thickness of the water layer; and re-activating and re-deactivating the water spray until the ozone substantially removes portions of the layer from the semiconductor wafer.

Another aspect of the invention relates to an ozone shower system that comprises an ozone source. The ozone source is configured to supply ozone to a process chamber. The ozone shower system also comprises a sprayer connected to a fluid source such that fluid sprays over a workpiece in the process chamber. The ozone shower system further comprises a pump connected to the fluid source, and a selector valve connected to the pump. The selector valve is configured to selectively pulse the fluid through the sprayer.

An additional aspect of the invention relates to a method that comprises introducing a reagent to an ambient and activating a solution spray in the ambient for a first time period. The method also comprises deactivating the solution spray for a second time period, thereby increasing the efficiency of a reaction of the reagent and a workpiece.

Another embodiment of the invention is a reaction chamber that comprises a gas input and a plurality of nozzles connected to a nozzle manifold. The reaction chamber further comprises a wafer cartridge that holds wafers. The reaction chamber also comprises a first fluid line connected to the nozzle manifold. In addition, a second fluid line is configured to divert water flow away from the first water line.

Yet another embodiment of the invention is a reaction chamber that comprises at least one nozzle connected to a fluid supply wherein the nozzle is configured to pulse fluid onto a workpiece. The reaction chamber also comprises a rotator that rotates the workpiece at a velocity ranging from approximately 100 rpm to stationary.

Another aspect of the invention relates to an apparatus that comprises at least one wafer-processing chamber wherein an ozone rich environment exists within the wafer-processing chamber. The apparatus further comprises a sprayer, and a pulsating fluid source. The pulsating fluid source is configured to pulse a solution through the sprayer into the ozone rich environment.

An additional aspect of the invention relates to an apparatus that comprises at least one semiconductor processing chamber and a pulsating fluid source. The pulsating fluid source is configured to pulse an ozone-rich solution into the semiconductor processing chamber.

Yet another aspect of the invention relates to a method that comprises introducing a reagent into an ambient, and pulsing a solution spray in the ambient, thereby increasing the efficiency of a reaction of the reagent.

Another embodiment of the invention relates to an ozone shower system that comprises a process chamber and a pump. The pump is connected to the process chamber and configured to pulse a solution into the process chamber.

For the purposes of summarizing the invention, certain aspects, advantages and novel features of the invention have been described herein above. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein. Other aspects and advantages of the invention will also be apparent from the detailed description below and the appended claims.

BRIEF DESCRIPTION OF THE DRAWINGS

The present invention is described in more detail below in connection with the attached drawings, which are meant to illustrate and not to limit the invention, and in which.

DETAILED DESCRIPTION OF THE PREFERRED EMBODIMENTS

While illustrated in the context of using ozone to strip photoresist from a semiconductor wafer, the skilled artisan will find application for delivery of highly concentrated dissolved ozone in a wide variety of contexts. For example, the disclosed delivery of highly concentrated dissolved ozone has utility in many cleaning, etching, and stripping processes involved in the fabrication of a wide variety of workpieces. For example, the delivery of highly concentrated dissolved ozone has utility in PC Board fabrication and the like.

Figure 1:
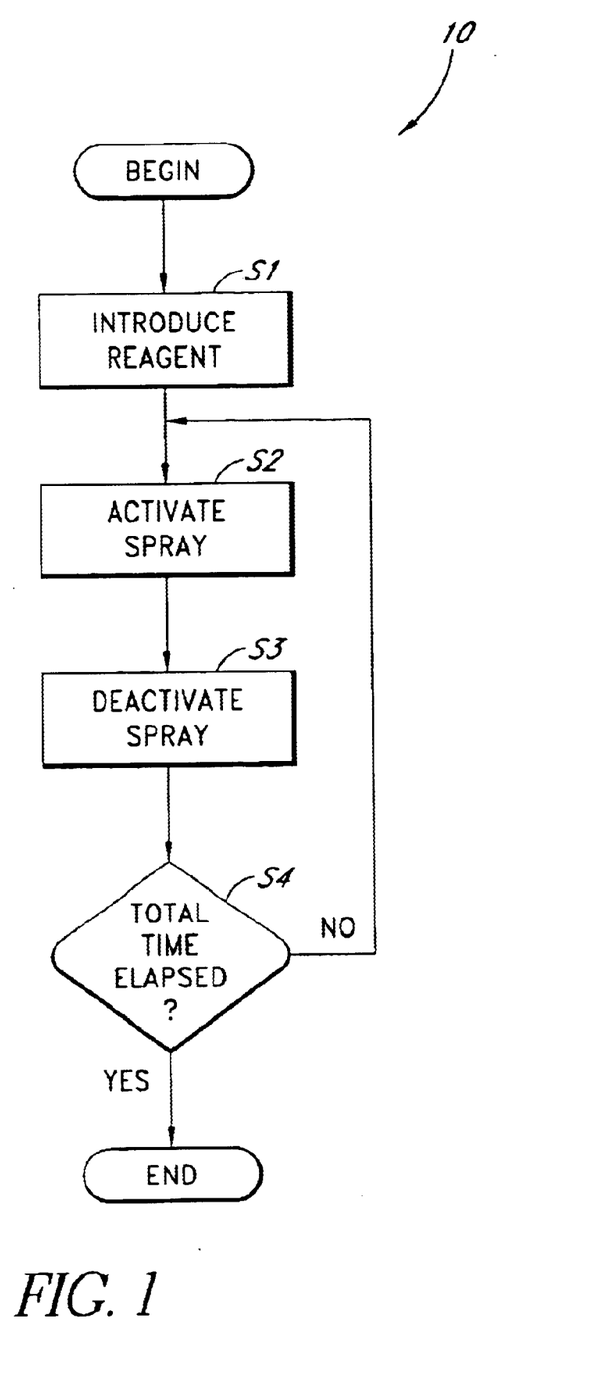
FIG. 1 illustrates a flow diagram of a pulsing process according to one embodiment of the invention.

FIG. 1 illustrates a flow diagram of a pulsing process 10 according to one embodiment of the invention. According to the pulsing process 10, Step S1 introduces a reagent into an environment where the reagent can react. Step S2 activates a solution spray. Step S3 deactivates the solution spray. Decision S4 determines if enough time has elapsed to substantially complete a desired reaction. If enough time has elapsed, the pulsing process 10 ends. However, if more time is required, the pulsing process 10 returns to Step S2, activates the solution spray, and repeats the steps disclosed above.

According to one embodiment, the reagent is ozone being introduced into the environment for any of a wide variety of reasons. For example, in the semiconductor fabrication industry, the ozone could be used to clean or sterilize the workpiece. The ozone could also be used to etch a semiconductor layer on, or strip another layer from the workpiece. According to one embodiment, the ozone strips a photoresist layer from the semiconductor wafer.

In addition, according to an embodiment of the invention, the solution includes deionized water. The deionized water acts both as a carrier of the ozone to the semiconductor wafer and as a cleaning solution for the byproducts of an ozone-photoresist reaction.

Thus, cycling through Step S2 (activation), Step S3 (deactivation), and Decision S4, the water spray is pulsed over the photoresist. The pulsing of the water establishes at least the following advantageous characteristics. First, the pulsing of the water advantageously provides less overall water to the photoresist. Less water creates a water boundary layer on the photoresist, thereby allowing the ozone to supersaturate the water above the water's normal ozone concentration capacity. This supersaturation, or highly concentrated dissolved ozone, increases the amount of ozone reaching the photoresist, thereby dramatically decreasing the time needed for the ozone to react with substantially all of the photoresist.

Second, the pulsing of the water increases its ability to wash away or remove the leftover and interfering byproducts of the ozone-photoresist reaction. For example, the water boundary layer pulses from the activation and deactivation of the spray. The pulsing helps loosen and break "chunks" of photoresist from the semiconductor substrate. The water boundary layer then washes away the chunks from interfering with further ozone-photoresist reactions, thereby increasing the effectiveness of the already highly concentrated dissolved ozone reaching the semiconductor wafer.

Accordingly, the pulsing process 10 decreases the time needed to substantially strip photoresist from the semiconductor wafer. The decrease in time advantageously speeds overall semiconductor fabrication process flows, thereby decreasing the overall cost of fabrication.

For example, according to one embodiment, the pulsing process 10 includes a duty cycle and a pulse rate. The duty cycle is the ratio between the time the water spray is activated, e.g., StepS2, and the cycle time, e.g., StepS2+

StepS3. On the other hand, the pulse rate is the inverse of the cycle time, i.e., $$\frac{1}{StepS2 + StepS3}.$$

According to one embodiment, the pulsing process 10 employs a 20% duty cycle. In this embodiment, approximately 5 seconds of water spray activation and is followed by approximately 20 seconds of water spray deactivation. Therefore, the pulse rate is approximately one pulse every 25 seconds.

By employing this pulse rate and duty cycle to the pulsing process 10, the time needed to substantially strip photoresist from the semiconductor wafer is dramatically decreased. For example, using a conventional constant spray process, approximately 12.6 k Å of hard baked (130° C. for 90 sec.) 10i photoresist can be substantially stripped from a selection of semiconductor wafers in 20 minutes. However, when the above-disclosed pulsing process 10 is employed, the same 12.6 k Å of 10i photoresist is substantially stripped from the selection of semiconductor wafers in just 5 minutes.

In other embodiments, the pulsing process 10 employs a 50% duty cycle wherein one second of spray activation is followed by approximately one second of water spray deactivation. Therefore, the pulse rate is approximately one pulse every 2 seconds. In yet other embodiments, the pulsing process 10 employs approximately an 8% duty cycle wherein five seconds of spray activation is followed by approximately sixty seconds of water spray deactivation. Therefore, the pulse rate is approximately one pulse every 60 seconds. The skilled artisan will recognize that pulse ranges can vary over a vide range including, but not limited to, approximately one pulse per minute to as many as 30 pulses per minute. In addition, the skilled artisan will recognize that the duty cycles can range from 3 percent up to 97 percent.

In one embodiment, the temperature of the water is heated from approximately 60° C. to approximately 95° C. In other embodiments, the water is maintained at an ambient temperature of approximately 20° C. In yet other embodiments, the water is maintained at sub-ambient temperatures less than 20° C. Thus, the temperature of the water can be calibrated to a wide range of temperatures including, but not limited to from less that 20° C. to more than 95° C.

Figure 2:
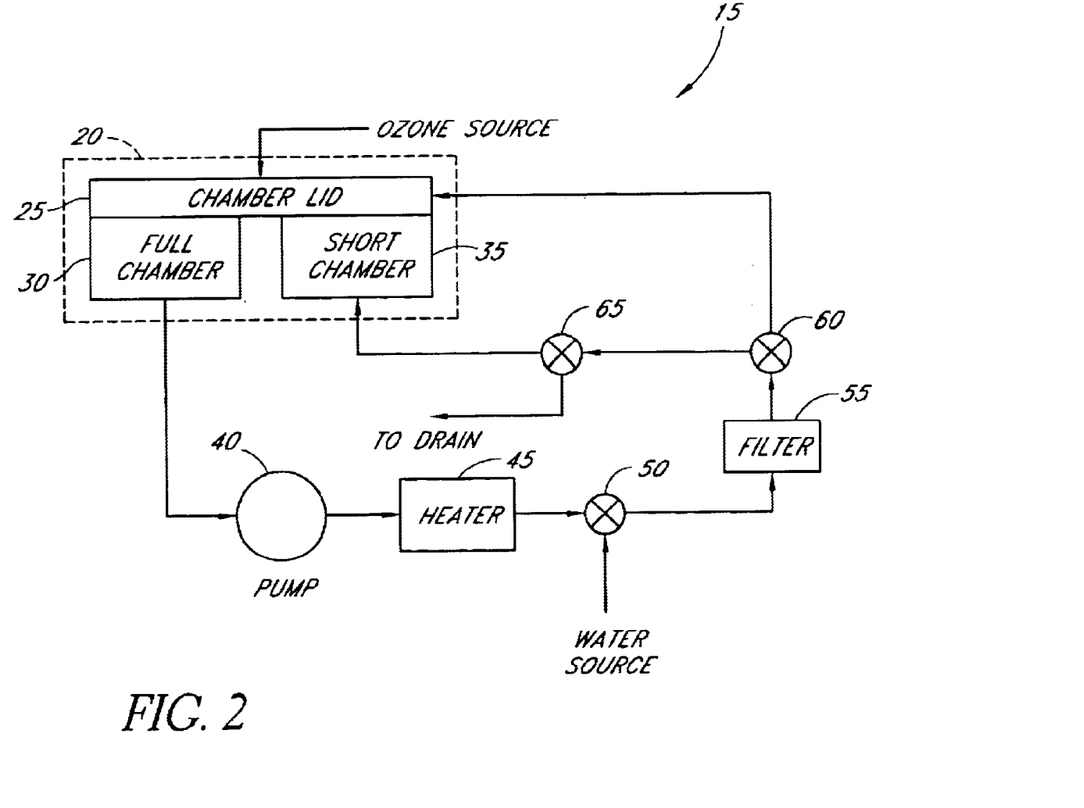
FIG. 2 illustrates a schematic of an ozone shower system, in accordance with another embodiment of the invention.

FIG. 2 illustrates a schematic of an ozone shower system 15 in accordance with one embodiment of the invention. The ozone shower system 15 includes a process chamber 20 having a chamber lid 25, a full chamber 30, and a short chamber 35. A pump 40 pumps water from the full chamber 30 to a heater 45. As the water passes through the heater 45, the heater 45 raises the water temperature to desired levels. The water then travels through a flush valve 50. The flush valve 50 allows for the addition of water to the ozone shower system 15. The water then flows through a filter 55 and on to a selector valve 60. The selector valve 60 directs the water into one of two paths. The filtered heated water directed through the first path travels to the chamber lid 25 and eventually to the full chamber 30. Thus, the water in the first path completes a water cycle from the fill chamber 30, through the pump 40, through a first path, and back to the fiull chamber 30.

On the other hand, the selector valve 60 could also direct the filtered heated water through a second path. The filtered heated water directed through the second path travels to a drain valve 65. The drain valve 65 allows for excess water removal from the ozone shower system 15. The filtered heated water in the second path then travels to the short chamber 35. After the short chamber 35 fills with water, excess water spills over into the full chamber 30. Thus, the water in the second path also completes a water cycle from the full chamber 30, through the pump 40, through the second path, and back to the full chamber 30.

Also illustrated in FIG. 2 is an ozone source. The ozone source supplies ozone to the ambient in the full chamber 30 through the chamber lid 25. Thus, according to the embodiment illustrated in FIG. 2, the ozone shower system 15 circulates water through the first or second path while an ozone rich environment exists in the full chamber 30. In other embodiments, the ozone from the ozone source is injected into the fluid in the first path, the second path or both paths. The injected ozone creates an ozone rich fluid that is applied to a workpiece as described in further detail below.

According to one embodiment of the invention, the pump 40 is a bellow pump commercially available from White Knight Fluid Handling, Inc. The heater 45 is an in-line heater commercially available from Santa Clara Plastics. In addition, the flush valve 50, the selector valve 60 and the drain valve 65 are three-way valves commercially available from Fluoroware. The filter 55 is an inert particle filter commercially available from Pall Corporation.

According to one embodiment, the ozone source is an Astex 8200 Ozone Generator configured to peak performance recommendations by the manufacturer. For example, the oxygen and nitrogen supplies are set to supply approximately greater than 13 percent by weight ozone concentration to the ambient.

However, it will be understood that a skilled artisan would recognize a wide variety of other types of ozone sources, filters, valves, heaters, and pumps could be advantageously employed in the ozone shower system 15. For example, a skilled artisan would recognize that the pump 40 could be a centrifuge pump. Moreover, the heater 45 could be a heat exchanger. In addition, the valves could be two-way valves. The filter 55 could be a charged particle filter. The ozone source could be an electrolytic type generator.

Figure 3:
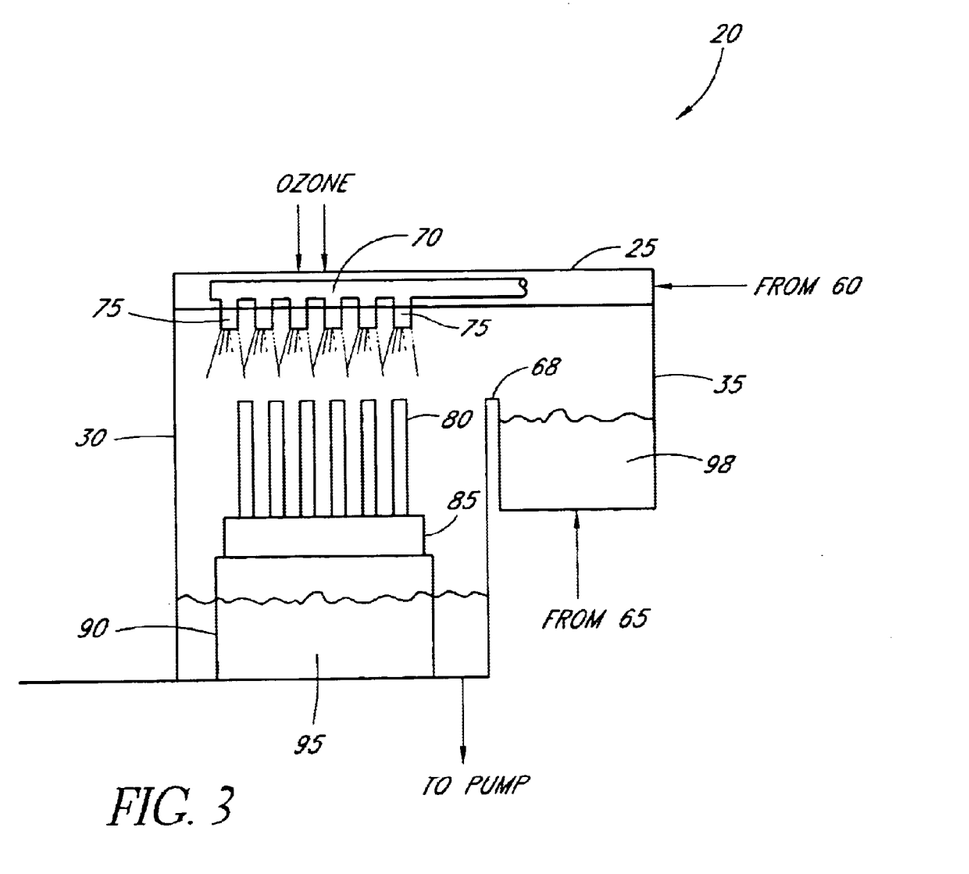
FIG. 3 illustrates a process chamber of FIG. 2.

FIG. 3 illustrates one embodiment of the process chamber 20. The process chamber 20 includes the chamber lid 25 covering the full chamber 30 and the short chamber 35. As shown in FIG. 3, the full chamber 30 and the short chamber 35 are separated by a wall 68. The wall 68 has a height less than that of the full chamber 30 such that a space exists between the top of the wall 68 and the chamber lid 25.

Moreover, according to this embodiment, the chamber lid 25 includes a water manifold 70 having an array of spray nozzles 75. The spray nozzles 75 are configured such that when the chamber lid 25 covers the full chamber 30 and the short chamber 35, the spray nozzles 75 extend above the full chamber 30. The full chamber 30 holds wafers 80 in a cassette 85. The cassette 85 rests on a stand 90. The stand 90, in turn rests on the bottom of the full chamber 30. A pump pool 95 fills the bottom of the full chamber 30 to a height less than that of the stand 90 such that the pump pool 95 does not reach the cassette 85 or the wafers 80. In addition, a diverted pool 98 fills the short chamber 35.

According to one embodiment, the spray nozzles 75 in the spray lid 25 are cone spray nozzles commercially available from Santa Clara Plastics. However, it will be understood that a skilled artisan would recognize that a wide variety of the spray nozzles 75 could be used in the chamber lid 25. For example, the chamber lid 25 could employ shower massage nozzles, knife-edge nozzles, or the like.

Moreover, according to one embodiment of the invention, the spray nozzles 75 attach to the water manifold 70 such that when activated, a substantially uniform water boundary layer forms on each of the wafers 80.

According to one embodiment, the cassette 85 holds 13 of the wafers 80 and is commercially available from Santa Clara Plastics. However, it will be understood that a skilled artisan would recognize that a wide variety of cassettes or other devices could be used to hold a wide number of the wafers 80. For example, the number of the wafers 80 for a given cassette is often simply vendor dependent. Moreover, the cassette 85 may be altogether avoided and the process chamber 20 could employ robot arms or the like. A robot arm for holding and exchanging the wafers 80 is commercially available from Submicron Systems.

Figure 4:
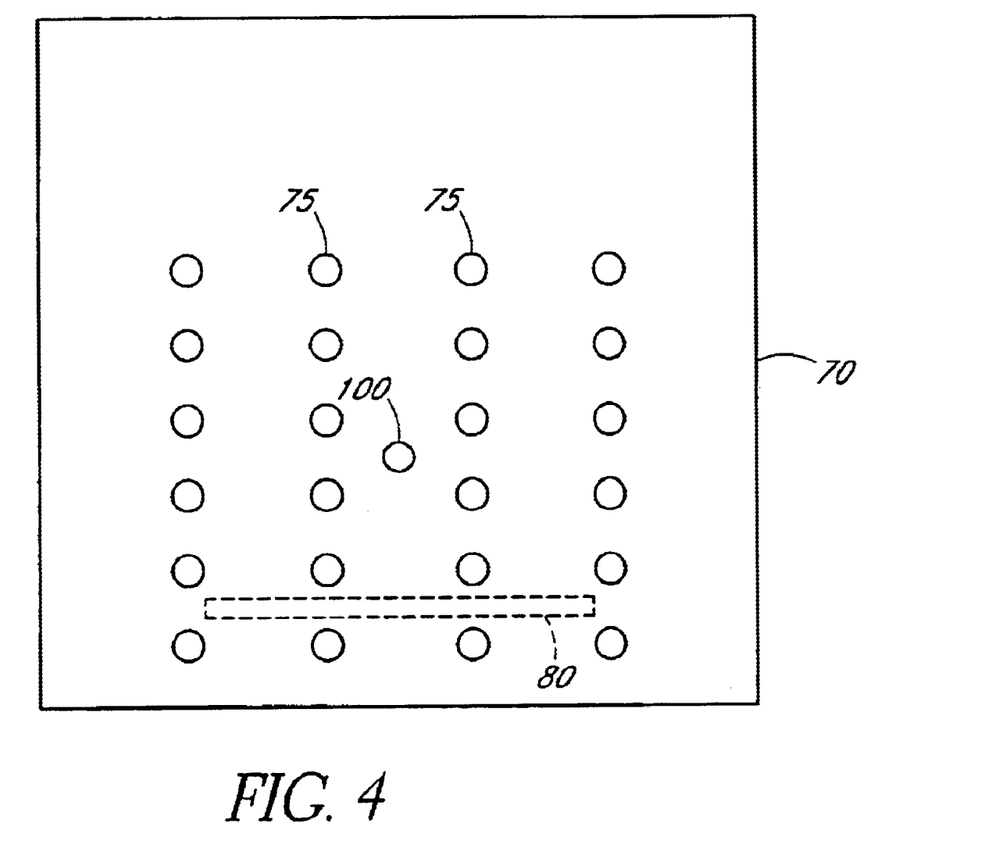
FIG. 4 illustrates a chamber lid of FIG. 3.

FIG. 4 illustrates an array of the spray nozzles 75 on the spray lid 25, according to one embodiment of the invention. FIG. 4 illustrates the array comprising six rows and four columns. The six rows and four columns are depicted from the perspective of the wafers 80 such that the wafers 80 align parallel to the rows. According to one embodiment, the spray nozzles 75 in the 6 rows are separated from each other by 1.75 inches and the spray nozzles 75 in the 4 columns are separated from each other by 2.5 inches. However, it will be understood that a wide variety of patterns and distances could be used arrange the spray nozzles 75 in order to provide the substantially uniform water boundary layer on the wafers 80.

According to this embodiment, the spray lid 25 further includes an ozone nozzle 100. For convenience, the ozone nozzle 100 and the spray nozzles 75 are the same, outside of the fact that the ozone nozzle 100 does not connect to the water manifold 70. Rather, the ozone nozzle 100 connects to the ozone source such that the ozone nozzle 100 supplies ozone into the ambient in the full chamber 30. Again, it will be understood that a skilled artisan would recognize a wide variety of devices and input areas where the ozone source could supply ozone to the process chamber 20. For example, the ozone nozzle 100 could be entirely different from the spray nozzles 75 and enter the process chamber 20 from a position other than the center of the array of the spray nozzles 75. Furthermore, the chamber lid 25 could comprise multiple ozone nozzles 100 creating multiple entry points for the ozone into the full chamber 30.

According to one embodiment, the ozone shower system 15 employs the pulsing process 10 in order to decrease the time needed to strip photoresist from the wafers 80. In Step S1, the ozone source of the ozone shower system 15 pumps ozone into the full chamber 30 through the ozone nozzle 100. According to this embodiment, the ozone concentration is at least 13 weight percent. Further, the pump 40 begins pumping water from the pump pool 95 through the heater 45. According to this embodiment, the heater 45 heats the water to approximately 60–95° C. The pump 40 then pumps the water though the filter 55 to remove contaminates. In Step S2, the selector valve 60 directs the now filtered heated water through the first path to the chamber lid 25 and the water manifold 70. The water manifold 70 distributes the filtered heated water to the array of the spray nozzles 75. The spray nozzles 75 spray the filtered heated water on the wafers 80 such that the water sheets over the photoresist, thereby forming the water boundary layer. As the filtered heated water sheets off the wafers 80, it falls through or around the cassette 85 and the stand 905 such that the filtered heated water collects in the pump pool 95. The selector valve 60 continues to direct the filtered heated water through the first path for approximately 5 seconds.

In Step S3, the selector valve 60 redirects the filtered heated water into the second path, thereby shutting off the supply of water to the spray nozzles 75. This redirection effectively deactivates the spray nozzles 75. The filtered heated water travels through the second path to the short chamber 35 where it flows into the diverted pool 98. When the diverted pool 98 becomes deeper than the height of the wall 68, the filtered heated water in the diverted pool 98 spills over the wall 68 and into the pump pool 95 in the full chamber 30. The water spilling over the wall 68 does not touch or effect the wafers 80, rather, it simply adds to the pump pool 95. The selector valve 60 continues to direct the filtered heated water through the second path for 20 seconds.

In Decision S4, the ozone shower system 15 determines whether five minutes has elapsed since first activating the pump 40. If so, the pump 40 shuts down. On the other hand, if 5 minutes has not elapsed, the selector valve 60 redirects the filtered heated water back through the first path and reactivates the spray nozzles 75, thereby restarting Step S2.

Using the selector valve 60 to redirect the filtered heated water advantageously makes continued starting and stopping the pump 40 unnecessary. By using redirection, the pump 40 continues to pump throughout the ozone-photoresist reaction time. Furthermore, the employment of the pump pool 95 advantageously ensures the pump 40 will not run dry and allows for recycling of the filtered heated water.

As mentioned above, employing the pulsing process 10 in the ozone shower system 15 advantageously reduces the time needed to strip substantially all the photoresist from the wafers 80. In addition, as mentioned above, the pulsing process 10 accomplishes this reduction without rotating the wafers 80 at high velocities. In fact, according to one embodiment, the wafers 80 are held stationary.

However, when the wafers 80 do not rotate, the water boundary layer should be as uniform as possible. Thicker areas of the water boundary layer can effect the ability of the water to transport the highly concentrated dissolved ozone to the photoresist, thereby slowing the stripping process. Typically, the water boundary layer may vary in thickness in at least two places. First, the cassette 85 typically uses two horizontal rods contacting the wafers 80. The surface tension of the horizontal rods contacting the wafers 80 tends to thicken the water boundary layer in those areas. Second, gravity can cause the water boundary layer to "channel" towards a point near the bottom of the wafers 80, thereby thickening the water boundary layer in that area as well.

Figure 5:
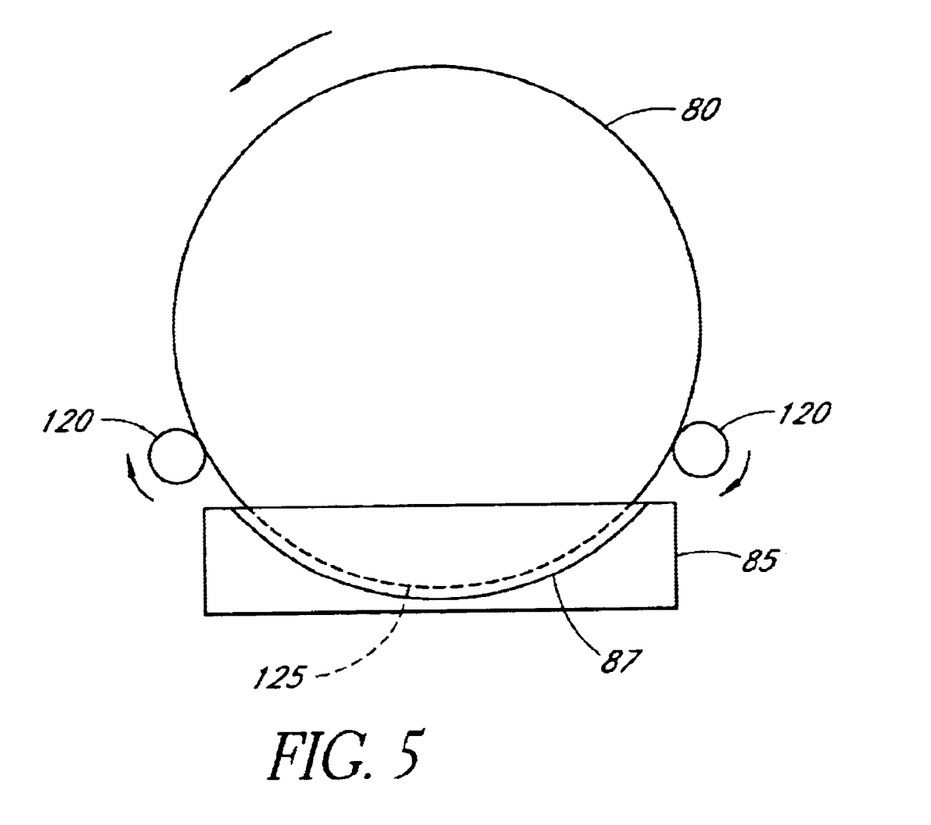
FIG. 5 illustrates a rotation mechanism of FIG. 2.

Therefore, according to one embodiment of the invention, the ozone shower system 15 slowly rotates the wafers 80 in order increase uniformity of the water boundary layer. For example, FIG. 5 illustrates a side view of the wafer 80 and the cassette 85. The cassette 85 includes a portion 87 that holds each wafer 80. The portion 87 could be the above-mentioned horizontal rods, or as shown in FIG. 5, the portion 87 could comprise a concave slot substantially matching the curvature of the bottom of the wafer 80. Each concave slot could correspond to each wafer 80 in the cassette. As illustrated in FIG. 5, when the wafers 80 are to be rotated, two rotating axles 120 contact the wafers 80. As shown, the two rotating axles 120 substantially support the wafers 80 allowing for a gap 125 to exist between the cassette 85 and the wafers 80.

According to one embodiment, the two rotating axles 120 rotate in the one direction such that the wafers 80 rotate in the other. For example, as shown in FIG. 5, the two rotating axles 120 rotate to the left, thereby rotating the wafers 80 to the right. However, it will be understood that a wide variety of rotating mechanisms could be used to rotate the wafers 80. For example, when the cassette 85 includes horizontal rods to support the wafers 80, those horizontal rods themselves could be rotated.

According to another embodiment, the two rotating axles 120 rotate the wafers 80 at velocities ranging from about 100 revolutions per minute (rpm) to stationary. According to one embodiment, the two rotating axles 120 rotate the wafers 80 at approximately 3 rpm.

The slow rotation of the wafers 80 changes both the area where the cassette 85 contacts the wafers 80, and which area of the wafers 80 comprises the bottom. Therefore, by slowly rotating the wafers 80, the ozone shower system 15 advantageously provides a more uniform water boundary layer. Through the more uniform water boundary layer, the ozone shower system 15 provides efficient transport of highly concentrated dissolved ozone to the photoresist on the wafers 80. The efficient transport dramatically reduces the processing time for the ozone-photoresist reaction, thereby increasing semiconductor process flow efficiency. Also, slow rotation of the wafers 80 avoids the mechanical complexity and risk of damage associated with very high rotation velocities.

Although one embodiment of the ozone shower system 15 employs slow rotation of the wafers 80, it will be understood that a skilled artisan would recognize a wide variety of other ways to create uniform water boundary layers. For example, the ozone shower system 15 could employ rotating spray nozzles 75 that correct for channeling and gravity problems. According to another embodiment, the ozone shower system 15 could aim the spray nozzles 75 such that the water spray contacts the wafers 80 in a manner that causes a slow rotation. For example, knife-edge spray nozzles could provide a spray that contacts only one side of the each wafer 80, thereby slowly rotating the wafer inside the cassette 85. Such an embodiment avoids the use of the two rotating axles 120.

On the other hand, the ozone shower system 15 could employ tipping mechanism that tips the wafers 80 from side to side in order to create uniform water boundary layers. Further, the ozone shower system 15 could employ non-mechanical means to combat non-uniformity. For example, surfactants, acid spiking, water vapor, heated workpiece, and very hot water could also be included to help improve the ozone-photoresist reactions.

Although the foregoing invention has been described in terms of certain preferred embodiments, other embodiments will be apparent to those of ordinary skill in the art. For example, the ozone could also be pulsed into the process chamber 20 and the ozone pulse could also have a limited duty cycle. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. An ozone shower system, comprising:
    an ozone source configured to supply ozone to a process chamber;
    at least one semiconductor workpiece positioned within a cassette, the cassette having a top and a bottom;
    at least two rotating axles within the process chamber, the two rotating axles positioned to support the semiconductor workpiece in a manner that creates a gap between the semiconductor workpiece and the bottom of the cassette so that the cassette can remain stationary while the rotating axles rotate the semiconductor workpiece;
    a sprayer positioned above the top of the cassette, the sprayer connected to a fluid source such that fluid sprays over the semiconductor workpieces in the process chamber;
    a pump connected to a fluid source; and
    a selector valve connected to the pump, the selector valve configured to selectively pulse the fluid through the sprayer.

2. The ozone shower system of claim 1 wherein the workpiece is a semiconductor wafer.

3. The ozone shower system of claim 2 further comprising a cassette that holds plurality of semiconductor wafers.

4. The ozone shower system of claim 3 wherein the cassette is configured to rotate.

5. An apparatus comprising:
    at least one wafer processing chamber wherein an ozone rich environment exists within the wafer-processing chamber;
    a rotator that creates a gap between a wafer and a wafer cassette, wherein the rotator rotates the wafer while allowing the cassette to remain substantially stationary;
    a sprayer; and
    a pulsating fluid source, the pulsating fluid source configured to pulse a solution through the sprayer into the ozone rich environment.

6. The apparatus of claim 5 wherein the solution is ozone rich.

7. The apparatus of claim 5 wherein the solution combines with the ozone in the ozone rich environment.

8. The apparatus of claim 5 wherein the sprayer comprises a plurality of spray nozzles.

9. The apparatus of claim 5 wherein the pulsating fluid source is configured to pulse at approximately one pulse every two seconds.

10. The apparatus of claim 5 wherein the pulsating fluid source is configured to pulse at range from approximately one pulse every two seconds to approximately five pulses every minute.

11. The apparatus of claim 5 wherein the pulsating fluid source has a 50% duty cycle.

12. The apparatus of claim 5 wherein the pulsating fluid source have a duty cycle the varies from 3% to 97%.

13. An apparatus comprising:
    at least one semiconductor processing chamber;
    a rotator that creates a gap between a wafer and a wafer cassette, wherein the rotator rotates the wafer; and
    a pulsating fluid source, the pulsating fluid source configured to pulse an ozone-rich solution into the semiconductor-processing chamber.

14. The apparatus of claim 13 wherein the ozone-rich solution further combines with ozone in the semiconductor processing chamber.

15. The apparatus of claim 13 further comprising a spray nozzle that directs the pulsating fluid into the semiconductor-processing chamber.

16. The apparatus of claim 13 wherein the pulsating fluid source is configured to pulse at approximately one pulse every two seconds.

17. The apparatus of claim 13 wherein the pulsating fluid source is configured to pulse at range from approximately one pulse every two seconds to approximately five pulses every minute.

18. The apparatus of claim 13 wherein the pulsating fluid source has a 50% duty cycle.

19. The apparatus of claim 13 wherein the pulsating fluid source have a duty cycle the varies from 3% to 97%.

20. An apparatus for removing a portion of a semiconductor workpiece, the apparatus comprising; p1 a fluid source configured to vary a fluid from a greater flow to a lesser flow, wherein a duty cycle of the varying fluid comprises an amount of time the fluid flows at the greater flow versus an amount of time the fluid flows at the lesser flow plus the amount of time the fluid flows at the greater flow;
- one or more nozzles capable of spraying the varying fluid over a semiconductor workpiece; and
- at least one rotator configured to at least partially separate the semiconductor workpiece from a carrier, the rotator further configured to rotate the semiconductor workpiece at one or more speeds to, in conjunction with one or more duty cycles of the varying fluid, to control a thickness of a boundary layer of the varying fluid on the workpiece,
- wherein varying the thickness of the boundary layer varies an amount of ozone that is transferred to the workpiece and wherein the ozone and the varying fluid enhance the removal of a portion of the workpiece.

21. The apparatus of claim 20, wherein the lesser flow comprises substantially no flow, thereby creating a pulse of fluid during the greater flow.

22. The apparatus of claim 20, wherein the varying fluid varies from the lesser flow to the greater flow at approximately one time every two seconds.

23. The apparatus of claim 20, wherein the varying fluid varies from the lesser flow to the greater flow at range of approximately one time every two seconds to approximately five times every minute.

24. The apparatus of claim 20, wherein the one or more duty cycles include a 50% duty cycle.

25. The apparatus of claim 20, wherein the one or more duty cycles include a range of duty cycles between 3% and 97%.

26. The apparatus of claim 20, wherein the one or more duty cycles vary between 3% and 97%.

27. The apparatus of claim 20, wherein the one or more speeds include a range of speeds not exceeding approximately 100 revolutions per minute (RPM).

28. The apparatus of claim 20, wherein the one or more speeds are below approximately 100 RPM.

29. The apparatus of claim 20, wherein the one or more speeds include 3 RPM.

30. The apparatus of claim 20, wherein a temperature of the varying fluid ranges from approximately 20° C. to approximately 95° C.

31. The apparatus of claim 20, wherein a temperature of the varying fluid ranges from approximately 60° C. to approximately 95° C.

* * * * *